US010896978B2

(12) United States Patent
Goto et al.

(10) Patent No.: US 10,896,978 B2
(45) Date of Patent: Jan. 19, 2021

(54) OXIDE SEMICONDUCTOR DEVICE AND METHOD FOR MANUFACTURING SAME

(71) Applicants: V TECHNOLOGY CO., LTD., Kanagawa (JP); TOHOKU UNIVERSITY, Miyagi (JP)

(72) Inventors: Tetsuya Goto, Miyagi (JP); Michinobu Mizumura, Kanagawa (JP)

(73) Assignees: V TECHNOLOGY CO., LTD., Kanagawa (JP); TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 16/343,022

(22) PCT Filed: Sep. 4, 2017

(86) PCT No.: PCT/JP2017/031817
§ 371 (c)(1),
(2) Date: Apr. 18, 2019

(87) PCT Pub. No.: WO2018/074083
PCT Pub. Date: Apr. 26, 2018

(65) Prior Publication Data
US 2019/0288115 A1   Sep. 19, 2019

(30) Foreign Application Priority Data

Oct. 21, 2016   (JP) ................. 2016-206647

(51) Int. Cl.
*H01L 29/786*   (2006.01)
*H01L 21/425*   (2006.01)
*H01L 29/66*   (2006.01)

(52) U.S. Cl.
CPC ........ *H01L 29/7869* (2013.01); *H01L 21/425* (2013.01); *H01L 29/66969* (2013.01); *H01L 29/786* (2013.01); *H01L 29/78693* (2013.01)

(58) Field of Classification Search
None
See application file for complete search history.

(56) References Cited

U.S. PATENT DOCUMENTS

2012/0001173 A1* 1/2012 Suzuki ............. H01L 29/66757
                                                           257/43
2014/0231798 A1   8/2014 Ono et al.
2017/0200790 A1* 7/2017 Hitora ................. H01L 29/7787

FOREIGN PATENT DOCUMENTS

JP    2010-219538 A    9/2010
JP    2011-101027 A    5/2011
(Continued)

OTHER PUBLICATIONS

Yang, Y-H "Performance Improvements of IGZO and ZnO thin-film transistors by laser-irradiation treatment" Jour. of SID vol. 19, Iss. 3 published Jun. 18, 2012 pp. 247-252 (Year: 2012).*
(Continued)

*Primary Examiner* — Grant S Withers
(74) *Attorney, Agent, or Firm* — Osha Bergman Watanabe & Burton LLP

(57) ABSTRACT

In an oxide semiconductor device including an active layer region constituted by an oxide semiconductor, stability when a stress is applied is improved. The oxide semiconductor device includes an active layer region constituted by an oxide semiconductor of indium (In), gallium (Ga), and zinc (Zn), wherein the active layer region contains an element selected from titanium (Ti), zirconium (Zr), and hafnium (Hf) that are Group 4 elements, or carbon (C), silicon (Si), germanium (Ge), and tin (Sn) that are Group 14 elements at a number density in a range of $1\times10^{16}$ to $1\times10^{20}$ cm$^{-3}$.

3 Claims, 3 Drawing Sheets

(56) References Cited

FOREIGN PATENT DOCUMENTS

| JP | 2012-028481 A | 2/2012 |
|---|---|---|
| JP | 2013-041945 A | 2/2013 |
| JP | 2013-110176 A | 6/2013 |
| JP | 2015-228495 A | 12/2015 |

OTHER PUBLICATIONS

Kim, Y. "Effects of Ion Implantation doping on the Characteristics of Amorphous Indium Gallium Zinc Oxide Thin Films" Adv. Mat. vol. 8, pp. 267-271 Feb. 2016 pp. 267-271 (Year: 2016).*
Goto, Tetsuya "Improvement in the Negative Bias Illumination Stress Stability for Silicon-Ion Implanted Amorphous InGaZnO Thin-Film Transistors" IEEE Elec. Dev. Lett. vol. 38, No. 3 first published Jan. 27, 2017 (Year: 2017).*
English Language Translation of JP 2012/028481A (Year: 2010).*
Klockenkamper, R "Near-surface density of ion-implanted Si studied by Rutherford backscattering and total-reflection x-ray fluorescence" Jour. of Appl. Phys. 98 Aug. 2005 pp. 033517-1 through 033517-5 (Year: 2005).*
Belloni, F. "Ion Implantation via a laser ion source" Dept. of Phys. Ph.D. Thesis 2006 pp. 1-109 (Year: 2006).*
Zhang, X. "The Performance of Zr-Doped Al—Zn—Sn—O Thin Film Transistor Prepared by Co-Sputtering" App. Sci. 9, 5150 Nov. 28, 2019 pp. 1-12 (Year: 2019).*
Xiao, P. "High-mobility ZrInO thin-film transistor prepared by an all-DC-sputtering method at room temperature" Nat. Sci. Rep. 6 Apr. 27, 2016 pp. 1-7 (Year: 2016).*
Wu. J. "High-Performance Fully Transparent Hafnium-Doped Zinc Oxide TFTs Fabricated at Low Temperature" SID 2014 Digest Jul. 7, 2014 pp. 997-1000 (Year: 2014).*
Parthiban, S. "Role of dopants as a carrier suppressor and strong oxygen binder in amorphous indium-oxide-based field effect transistor" Mat. Res. vol. 29, No. 15, Aug. 14, 2014 pp. 1585-1596 (Year: 2014).*
Parthiban, S. "Carbon-Incorporated Amorphous Indium Zinc Oxide Thin-Film Transistors" Jour. of Elec. Mat. vol. 43, No. 11, Aug. 22, 2014 pp. 4224-4228 (Year: 2014).*
Liu, W-S "Using Ti-doped GaZnO/InGaZnO/Ti-doped GaZnO sandwich composite Structure to enhance the device performances of transparent thin-film transistors" 2017 24th Int. Work. on A-M Flat. Disp. and Dev. Aug. 15, 2017 pp. 173-175 (Year: 2017).*
Liu, W-S. "Capping Ti-Doped GaZnO on InGaZnO Layer as the Composite-Channel Structure for Enhancing the Device Performances and Stability of Thin-Film Transistors" Journ. of Displ. Tech. vol. 12, No. 12 Dec. 2016 pp. 1554-1559 (Year: 2016).*
Kamiya, T. "Origins of High Mobility and Low Operation Voltage of Amorphous Oxide TFTs: Electronic Structure, Electron Transport, Defects and Doping" Jour. of Disp. Tech. vol. 5, No. 12 Dec. 2009 pp. 468-483 (Year: 2009).*
Hsu, H-H. "High Mobility Bilayer Metal—Oxide Thin Film Transistors Using Titanium-Doped InGaZnO" IEEE Elec. Dev. Lett. vol. 35, No. 1 Jan. 2014 pp. 87-89 (Year: 2014).*
Cho, S. "Effects of Yttrium Doping on a-IGZO Thin Films for Use as a Channel Layer in Thin-Film Transistors" Coatings 2019 9, 44 Jan. 15, 2019 pp. 1-8 (Year: 2019).*
International Search Report issued in Application No. PCT/JP2017/031817, dated Oct. 10, 2017 (3 pages).
Written Opinion issued in Application No. PCT/JP2017/031817, dated Oct. 10, 2017 (5 pages).
Notice of Reasons for Refusal issued in corresponding Japanese Patent Application No. 2016-206647 dated Nov. 10, 2020 (6 pages).

* cited by examiner

OXIDE SEMICONDUCTOR DEVICE AND METHOD FOR MANUFACTURING SAME

TECHNICAL FIELD

The present invention relates to an oxide semiconductor device and a method for manufacturing the same.

BACKGROUND ART

A TFT (Thin Film Transistor) is widely used for active elements of a flat panel display that is formed on a glass substrate. The TFT is a three-terminal device that consists of a gate, a source, and a drain as its basic constitution, uses a semiconductor thin film deposited on a substrate as a channel layer in which electrons or holes flow, and has the function of applying voltage to the gate to control a current flowing to the channel layer, and switch the current between the source and the drain.

While a polycrystalline silicon thin film or an amorphous silicon thin film is widely used as the channel layer of the TFT, with the prevalence of mobile electronic equipment represented by a smartphone, image display performance having ultra-high definition, high image quality, and low power consumption is required of a display having a small screen, and an oxide semiconductor attracts attention as a TFT material capable of achieving the image display performance.

It is known that, among oxide semiconductors, an IGZO which is an oxide of indium (In), gallium (Ga), and zinc (Zn) is the TFT material that allows high definition and low power consumption of the display as compared with conventional amorphous silicon or the like. PTL 1 shown below describes that a transparent amorphous oxide thin film is deposited by the chemical vapor deposition and is constituted by elements that are In, Ga, Zn, and O, the transparent amorphous oxide thin film is a transparent semi-insulating amorphous oxide thin film in which the composition of the oxide when the oxide is crystallized is $InGaO_3(ZnO)_m$ (m is a natural number less than 6), and the electron mobility is more than 1 $cm^2(V \cdot s)$, and the electron carrier concentration is not more than $10^{16}/cm^3$ when the transparent semi-insulating amorphous oxide thin film is not doped with an impurity ion, and the transparent semi-insulating amorphous oxide thin film is used as the channel layer of the TFT.

CITATION LIST

Patent Literature

[PTL 1] Japanese Patent plication Publication No. 2010-219538

SUMMARY OF INVENTION

As described above, the IGZO is effective as the channel material of the TFT for the display, but there is room for improvement in a TFT characteristic resulting from a defect caused by oxygen deficiency, particularly in stability of a threshold voltage when a stress is applied. In particular, mobile electronic equipment is supposed to be used outdoors, and hence the mobile electronic equipment is required to cope with use situations in which the mobile electronic equipment is subject to stresses such as sunlight irradiation and temperature increase, and a problem arises in that a light stress caused by backlight is accumulated as a result of a long continuous operation.

The present invention has been proposed in order to cope with such a problem. That is, the present invention is to improve stability when a stress is applied in an oxide semiconductor device that includes an active layer region of an oxide semiconductor.

In order to solve such a problem, an oxide semiconductor device according to the present invention has the laming constitution.

The oxide semiconductor device according to the present invention is an oxide semiconductor device including an active layer region constituted by an oxide semiconductor of indium (In), gallium (Ga), and zinc (Zn), wherein the active layer region contains an element selected from titanium (Ti), zirconium (Zr), and hafnium (Hf) that are Group 4 elements, or carbon (C), silicon (Si), germanium (Ge), and tin (Sn) that are Group 14 elements at a number density in a range of $1 \times 10^{16}$ to $1 \times 10^{20}$ $cm^{-3}$.

DESCRIPTION OF EMBODIMENT

Figure 1:
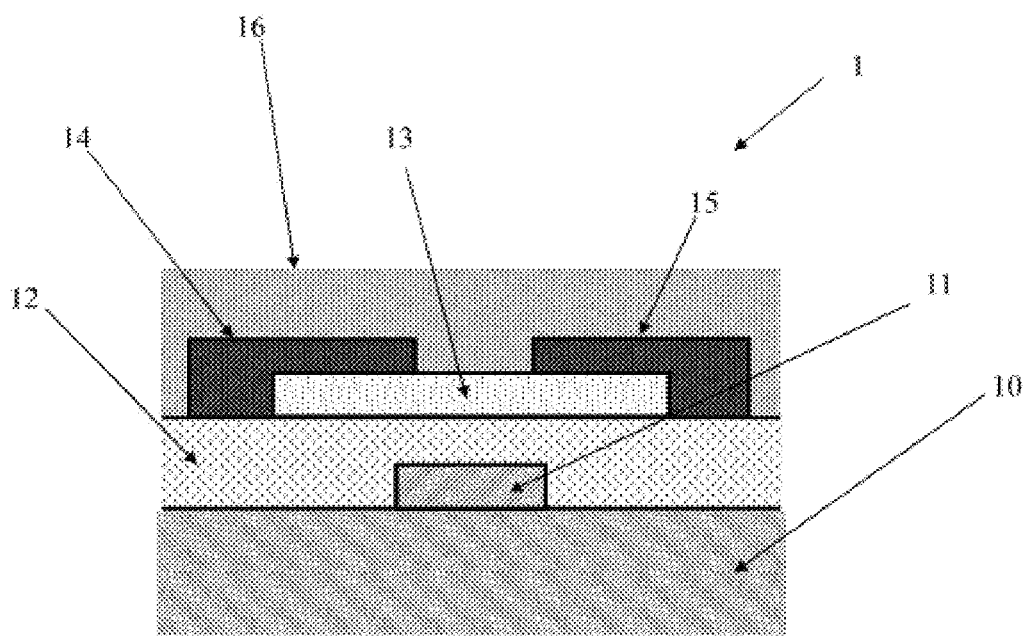
FIG. 1 is an explanatory view showing an example of the structure of a TFT.

Hereinafter, an embodiment of the present invention will be described with reference to the drawings. FIG. 1 shows an example of the constitution of a TFT that is an oxide semiconductor device according to the embodiment of the present invention. In a TFT 1, a gate 11 is formed on a glass substrate 10, a gate insulation film 12 is formed so as to cover the gate 11, and a channel layer 13 and a source 14 and a drain 15 that are in contact with the channel layer are formed on the gate insulation film 12. In addition, a passivation film 16 is formed so as to cover the channel layer 13, the source 14, and the drain 15.

With regard to materials of the respective terminals, for example, the gate 11, the source 14, and the drain 15 are constituted by TiN, and the gate insulation film 12 and the passivation film 16 are constituted by $SiO_2$. As will be described later, the channel layer 13 serving as an active layer region is constituted by an oxide semiconductor of In, Ga, and Zn (IGZO) into which a specific element is implanted. The TFT 1 has the function of applying voltage to the gate 11 to control a current flowing to the channel layer 13 and switch the current between the source 14 and the drain 15.

The elements implanted into the channel layer 13 are Ti, Zr, and Hf that are Group 4 elements or C, Si, Ge, and Sn that are Group 14 elements. Hereinafter, although a description will be made by taking the case where Si is implanted as an example, each of the elements mentioned above can achieve the same effect. With regard to the element implantation amount, the element in an amount that allows a material other than a bulk material to function as an impurity is implanted into the oxide semiconductor and, with this, it is possible to improve a TFT characteristic resulting from a defect caused by oxygen deficiency, particularly stability of a threshold voltage. The preferable element implantation amount is a number density in a range of $1 \times 10^{16}$ to $1 \times 10^{20}$ $cm^{-3}$.

Hereinafter, a specific process example (Example 1) for obtaining the TFT 1 having the constitution shown in FIG. 1 will be shown. First, the gate 11 is formed by depositing TiN to a thickness of about 150 nm on the glass substrate 10 using sputtering and pattering TiN using photolithography and etching. The material of the gate 11 is not limited to TiN and may also be Al, Ti, Mo, or W.

Next, the gate insulation film 12 is formed by depositing $S_iO_2$ using the plasma CVD (gas $SiH_4$, $O_2$, Ar). The material of the gate insulation film 12 is not limited to $SiO_2$ and may also be a silicon nitride film or $Al_2O_3$.

Thereafter, by using a target of an IGZO (In:Ga:Zn=1:1:1), the channel layer 13 is deposited by sputtering. As an example of deposition conditions, a film thickness was set to 50 nm, pressure was set to 5 m Torr and $O_2$ partial pressure was set to 16% in an $Ar/O_2$ atmosphere. In this deposition, it is possible to use, e.g., a rotary magnet sputtering apparatus. The element ratio of the IGZO in the channel layer 13 is not limited to the above-described ratio (In:Ga:Zn=1:1:1).

Note that the above-described $O_2$ partial pressure of 16% is a condition under which an amount of oxygen deficiency is equal to or less than $1\times10^{17}$ cm$^{-3}$ after anneal at 400° C. in a water vapor atmosphere that is performed later. On the other hand, in a conventional IGZO film (channel layer) into which the element is not implanted, deposition is performed at the $O_2$ partial pressure of 2%. In this case, the amount of oxygen deficiency after anneal is performed at 400° C. is about $1\times10^{18}$ cm$^{-3}$.

After the deposition described above, Si is implanted into the channel layer 13 of the IGZO by using an ion implantation apparatus. As an example of implantation conditions, a Si$^+$ ion was used, an energy was set to 40 keV, and a dose amount was set to $1\times10^{13}$ cm$^{-2}$. With this, a Si atom was implanted into the IGZO film at a density of $1\times10^{18}$ cm$^{-3}$. The density of the Si atom in the IGZO is set to $1\times10^{16}$ to $1\times10^{20}$ cm$^{-3}$ and is preferably set to $1\times10^{17}$ to $1\times10^{19}$ cm$^{-3}$.

After the implantation of Si, anneal is performed for one hour at 400° C. in a wet atmosphere ($H_2O/O_2$=100/900 sccm). The anneal temperature is not limited to 400° C., is from 300° C. to 800° C. and is preferably from 350° C. to 500° C. The atmosphere in which the anneal is performed is not limited to the wet atmosphere and may also be an oxygen atmosphere.

The IGZO film into which Si is implanted is patterned by photolithography and etching after being subjected to the above-described anneal, and the island-shaped channel layer 13 is thereby formed.

Thereafter, TiN forming the source 14 and the drain 15 is deposited to a thickness of, e.g., 150 nm, and the source 14 and the drain 15 are formed by photolithography and etching. The material of the source 14 and the drain 15 is not limited to Ti and may also be Al, Ti, Mo, or W. Thereafter, $SiO_2$ forming the passivation film 16 is deposited by the plasma CVD or the like, and a connection terminal is then formed so as to be able to come into electrical contact with the individual terminals (the source 14, the drain 15, and the gate 11) by photolithography and etching.

In a test, it was observed that the thus obtained TFT 1 (see FIG. 1) exhibited a stable TFT characteristic to continuous application of a negative bias·a light stress. With regard to test conditions, device dimensions were set to channel length: 40 μm and channel width: 20 μm and, with regard to stress conditions, −20 V was applied as a gate voltage, and light irradiation (30,000 lx) that uses a white LED was performed at an atmosphere temperature of 60° C.

Figure 2:
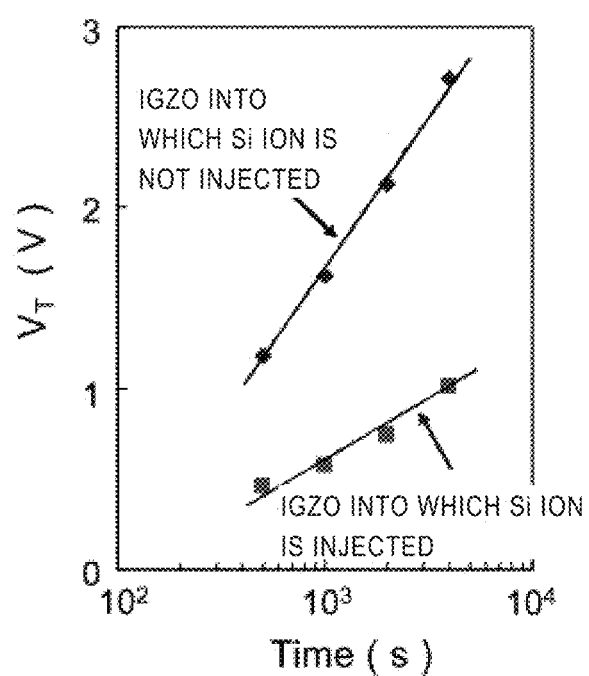
FIG. 2 is a graph showing that a TFT having an IGZO active layer region into which an Si ion is implanted has stability when a stress is applied.

FIG. 2 shows the change of the threshold voltage ($\Delta V_T$ (V)) of the TFT 1 in the case where the above-described stress is applied over time. As shown in FIG. 2, it is possible to determine that the temporal change of the threshold voltage ($\Delta V_T$ (V)) in the TFT 1 including the channel layer 13 of the IGZO film into which the Si ion is implanted is smaller than that in the TFT including the channel layer of the IGZO film into which the Si ion is not implanted.

The test result described above indicates that the stability of the operation of the TFT is improved by implanting a predetermined amount of Si into the IGZO film of the active layer region. The above-described result is obtained because, instead of a carrier resulting from the oxygen deficiency, Si functions as a dopant to supply an electron serving as the carrier, and a deep level trap in the band gap of the IGZO that formed due to the oxygen deficiency is reduced.

Next, another process example (Example 2) will be described. In this example, local laser anneal that used a XeF laser having a wavelength of 400 nm or less was performed before the anneal in the wet atmosphere in the above-described process example (Example 1). The other part of the process is identical to that of Example 1.

A laser energy density in laser anneal was set to 150 mJ/cm$^2$ per irradiation, and anneal was performed by superimposing one irradiation on another. The area of an annealed region was set to 60 μm×60 μm, and the region was annealed such that the active layer region serving as the channel layer 13 of the TFT was included in the region. The pattern of the gate 11 was used for the alignment of the laser irradiation. Note that it is not possible to use the gate 11 for the alignment in the case where a top gate TFT is produced. However, by forming some alignment patterns flexibly, it becomes possible to perform local laser anneal on the active layer region with high accuracy.

Figure 3:
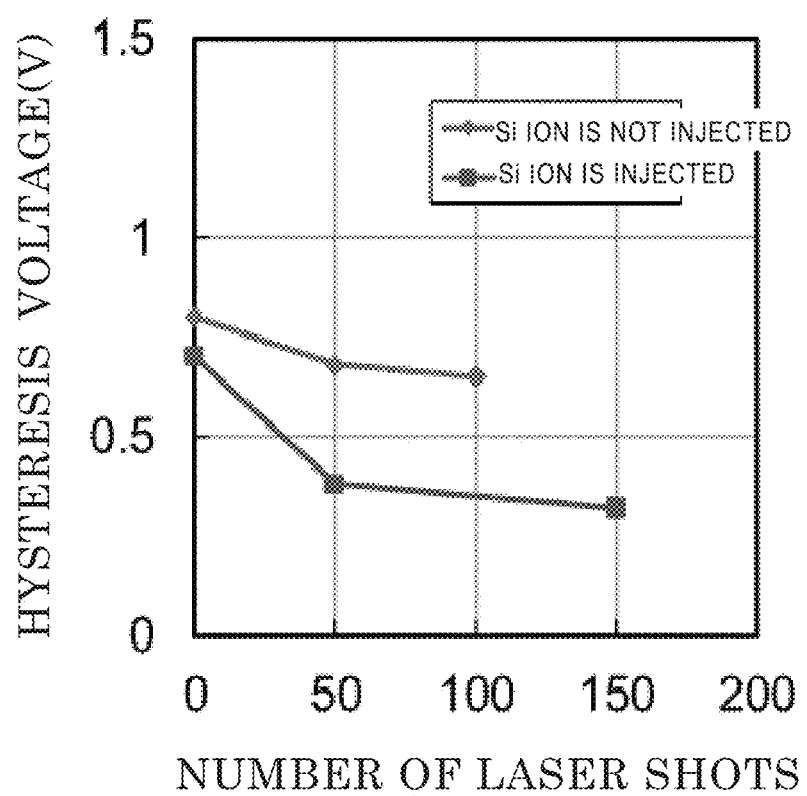
FIG. 3 is a graph showing that the hysteresis voltage of the TFT can be reduced by performing laser anneal on the IGZO active layer region into which the Si ion is implanted.

FIG. 3 is a graph in which a hysteresis voltage in the vicinity of the threshold voltage determined from transmission characteristics (gate voltage dependence of a drain current) of the TFT produced in the above-described process example is plotted with respect to the number of shots of the XeF laser anneal. FIG. 3 shows the case where the Si ion is not implanted and the case where the Si ion is not implanted.

The hysteresis voltage (V) of the vertical axis of the graph represents a deviation between a voltage characteristic in the case where the gate voltage is swept from negative voltage to positive voltage and a voltage characteristic determined by sweeping the gate voltage from positive voltage to negative voltage and, specifically, the hysteresis voltage was evaluated as a difference between the threshold voltages determined from both of the voltage characteristics.

As is clear from FIG. 3, it was determined that the hysteresis voltage of the TFT that used the IGZO in the active layer region was reduced and the stability of the TFT was improved by performing the local anneal that used the XeF laser. When a trap level that captures, e.g., an electron is present in the IGZO film, the hysteresis voltage increases and the device becomes unstable. However, by implanting Si into the active layer region of the IGZO and performing the laser anneal, the trap level that captures the electron is reduced.

As has been described thus far, with the oxide semiconductor device and the method for manufacturing the same according to the embodiment of the present invention, it is possible to improve the stability when the stress is applied and improve durability in outdoor use or use for a long period of time. In addition, it is possible to obtain the device having high stability by additionally performing the laser anneal on the active layer region.

REFERENCE SIGNS LIST

1 TFT
10 Glass substrate
11 Gate
12 Gate insulation film
13 Channel layer
14 Source
15 Drain
16 Passivation film

The invention claimed is:

1. An oxide semiconductor device comprising:
    an active layer region constituted by an oxide semiconductor of indium (In), gallium (Ga), and zinc (Zn), wherein the active layer region contains an element selected from titanium (Ti), zirconium (Zr), and hafnium (Hf) that are Group 4 elements, or carbon (C), silicon (Si), germanium (Ge), and tin (Sn) that are Group 14 elements at a number density in a range of $1\times10^{16}$ to $1\times10^{20}$ cm$^{-3}$.

2. The oxide semiconductor device according to claim 1, wherein
    the active layer region is a region that is irradiated with a laser having a wavelength of 400 nm or less and annealed.

3. A method for manufacturing an oxide semiconductor device including an active layer region constituted by an oxide semiconductor of indium (In), gallium (Ga), and zinc (Zn), the method comprising the steps of:
    implanting an ion of an element selected from titanium (Ti), zirconium (Zr), and hafnium (Hf) that are Group 4 elements, or carbon (C), silicon (Si), germanium (Ge), and tin (Sn) that are Group 14 elements at a number density in a range of $1\times10^{16}$ to $1\times10^{20}$ cm$^{-3}$ into the active layer region; and
    irradiating the active layer region into which the ion is implanted, with a laser having a wavelength of 400 nm or less to anneal the active layer region.

* * * * *